(12) United States Patent
Asano et al.

(10) Patent No.: US 7,883,824 B2
(45) Date of Patent: Feb. 8, 2011

(54) METHOD FOR EVALUATING LITHOGRAPHY APPARATUS AND METHOD FOR CONTROLLING LITHOGRAPHY APPARATUS

(75) Inventors: Masafumi Asano, Yokohama (JP); Kenji Yoshida, Oita (JP); Masahiro Kanno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 12/405,710

(22) Filed: Mar. 17, 2009

(65) Prior Publication Data

US 2009/0246654 A1    Oct. 1, 2009

(30) Foreign Application Priority Data

Mar. 27, 2008   (JP)   ............................. 2008-083423

(51) Int. Cl.
*G03C 5/00*   (2006.01)
*G03F 9/00*   (2006.01)

(52) U.S. Cl. .......................... 430/30; 430/322; 430/330
(58) Field of Classification Search .................. 430/30, 430/322, 330
See application file for complete search history.

(56) References Cited

U.S. PATENT DOCUMENTS

| 6,667,139 | B2 | 12/2003 | Fujisawa et al. |
| 6,919,153 | B2 | 7/2005 | Fujisawa et al. |
| 7,396,621 | B2 | 7/2008 | Fujisawa et al. |
| 2003/0054642 | A1 | 3/2003 | Kagotani et al. |
| 2005/0008979 | A1 | 1/2005 | Hayasaki et al. |
| 2005/0030502 | A1 | 2/2005 | Fujisawa et al. |
| 2007/0212801 | A1 | 9/2007 | Kanno et al. |

FOREIGN PATENT DOCUMENTS

JP   2001-102282   4/2001

OTHER PUBLICATIONS

Ausschnitt et al.; "Distinguishing Dose, Focus and Blur for Lithography Characterization and Control", Proc. of SPIE, vol. 6520, pp. 65200M-1-65200M-8, (2007).
Zhou et al.; "Advanced Lithography Parameters Extraction by Using Scatterometry System", Proc. of SPIE, vol. 6518, pp. 651823-1-651823-11, (2007).

*Primary Examiner*—Christopher G Young
(74) *Attorney, Agent, or Firm*—Finnegan, Henderson, Farabow, Garrett & Dunner, L.L.P.

(57) ABSTRACT

An evaluation method for lithography apparatus including a coating unit, an exposure unit, a heating unit and a development unit, the evaluation method including forming an evaluation resist pattern by using the lithography apparatus, the evaluation resist pattern including first and second evaluation patterns, the first and second evaluation patterns having different peripheral environments, measuring dimensions of the first and second evaluation patterns to obtain a dimensional difference between the first and second resist evaluation patterns, estimating an exposure dose of a resist when the resist is exposed by the exposure unit, the estimating the exposure dose being performed based on the dimensional difference between the first and second resist evaluation patterns, and estimating an effective heating temperature of the resist when the resist is heated by the heating unit, the estimating the effective heating temperature being performed based on the estimated exposure dose and the dimensional difference.

12 Claims, 4 Drawing Sheets

|  | Iso | Dense | IDB | DM | FM |
|---|---|---|---|---|---|
| Effective focus variation | ○ | × | ○ | × | ○ |
| Effective exposure dose — Exposure dose | △ | ○ | ○ | ○ | × |
| Effective exposure dose — PEB temperature variation | ○ | ○ | × | ○ | × |

METHOD FOR EVALUATING LITHOGRAPHY APPARATUS AND METHOD FOR CONTROLLING LITHOGRAPHY APPARATUS

CROSS-REFERENCE TO RELATED APPLICATIONS

This application is based upon and claims the benefit of priority from prior Japanese Patent Application No. 2008-083423, filed Mar. 27, 2008, the entire contents of which are incorporated herein by reference.

BACKGROUND OF THE INVENTION

1. Field of the Invention

The present invention relates to methods for evaluating and controlling a lithography apparatus used in manufacturing a semiconductor device.

2. Description of the Related Art

In recent years, process control of lithography steps have become important due to miniaturization of process dimensions. As one of the process control, it is known to control an exposure dose and focus independently by separating factor of dimensional distortion of a pattern to be formed on a wafer (dimension variation factor) into an exposure dose variation and a focus variation (Jpn. Pat. Appln. KOKAI Publication No. 2001-102282).

Here, the exposure dose means not only a setting exposure dose on an exposure equipment but also an exposure dose called effective exposure dose. The effective exposure dose is obtained by converting factors having influence for pattern dimensions on a wafer into the exposure dose. The factors are, for example, error of mask, and resist process such as a application, bake or development.

In recent investigations, the following result is reported. The result suggests that the influence upon the resist dimensions differs between temperature variation of post exposure bake (PEB) and the other factors relating to the factors of dispersion of the effective exposure dose. Specifically, the difference appears in a dimensional variation due to optical proximity effect (which appears in space dependency of line pattern dimensions). More specifically, relating to the dimensional difference between dimensions of dense line and dimensions of isolated line, the dimensional difference is large when the exposure dose at the time of exposure is changed, but the dimensional difference is small when the heating temperature at the time of PEB (PEB temperature) is changed.

The change in the exposure dose (exposure dose variation) and the change in the PEB temperature (PEB temperature variation) prevent accurate formation of a fine resist pattern. Therefore, it is important to accurately evaluate the exposure dose variation and the PEB temperature variation, and then reflect the evaluated results in the control of the lithography apparatus.

However, in the conventional technique, the lithography apparatus is evaluated by using an effective exposure dose variation which is obtained without separating the exposure dose variation and the PEB temperature variation. In addition, a technique which accurately separates the exposure dose variation and the PEB temperature variation, and then measures the respective variations has not been proposed.

That is, the conventional technique has not proposed a method for evaluating the lithography apparatus by separating the effective exposure dose variation into the exposure dose variation and the PEB temperature variation.

BRIEF SUMMARY OF THE INVENTION

According to an aspect of the present invention, there is provided an evaluation method for lithography apparatus, the lithography apparatus comprising a coating unit configured to apply resist on a substrate, an exposure unit configured to expose the resist applied on the substrate, a heating unit configured to heat the exposed resist and a development unit configured to develop the heated resist to form a resist pattern, the evaluation method comprising: forming an evaluation resist pattern by using the lithography apparatus, the evaluation resist pattern including first and second evaluation patterns, the first and second evaluation patterns having different peripheral environments respectively; measuring dimensions of the first and second evaluation patterns to obtain a dimensional difference between the first and second resist evaluation patterns; estimating an exposure dose of the resist when the resist is exposed by the exposure unit, the estimating the exposure dose being performed based on the dimensional difference between the first and second resist evaluation patterns; and estimating an effective heating temperature of the resist when the resist is heated by the heating unit, the estimating the effective heating temperature being performed based on the estimated exposure dose and the dimensional difference.

According to an aspect of the present invention, there is provided an control method for lithography apparatus, the lithography apparatus comprising a coating unit configured to apply resist on a substrate, an exposure unit configured to expose the resist applied on the substrate, a heating unit configured to heat the exposed resist, and a development unit configured to develop the heated resist to form a resist pattern, the control method comprising: setting a setting exposure dose on the exposure unit when the resist is exposed by the exposure unit such that an exposure dose difference is to be not higher than a predetermined value, the exposure dose difference being difference between the setting exposure dose and an exposure dose estimated by an evaluation method for lithography apparatus, the evaluation method comprising forming an evaluation resist pattern by using the lithography apparatus, the evaluation resist pattern including first and second evaluation patterns, the first and second evaluation patterns having different peripheral environments respectively; measuring dimensions of the first and second evaluation patterns to obtain a dimensional difference between the first and second resist evaluation patterns; estimating an exposure dose of the resist when the resist is exposed by the exposure unit, the estimating the exposure dose being performed based on the dimensional difference between the first and second resist evaluation patterns; and estimating an effective heating temperature of the resist when the resist is heated by the heating unit, the estimating the effective heating temperature being performed based on the estimated exposure dose and the dimensional difference; and setting a setting heating temperature on the heating unit when the resist is heated by the heating unit such that a heating temperature difference is to be not higher than a predetermined value, the heating temperature difference being difference between the setting heating temperature and the estimated effective heating temperature estimated by the evaluation method.

DETAILED DESCRIPTION OF THE INVENTION

Embodiments of the present invention will be described below with reference to the drawings.

First Embodiment

First, a substrate including a wafer and a resist applied on the wafer is prepared, and then While a setting exposure dose E is being changed per exposure field by, a circuit pattern drawn on a photomask is transferred onto the resist of the substrate by ArF exposure equipment. The wafer is, for example, a Si wafer. Next, The substrate (wafer+resist) is heated by hot plate, and the resist is subject to post exposure bake (PEB). Next, the resist which is subject to PEB undergoes a developing process so that a resist pattern is formed. A lithography process for forming the resist pattern is performed on a plurality of wafers. At this time, setting temperature of the hot plate, namely, PEB setting temperature is changed for each substrate.

The resist patterns formed on the plurality of wafers include two kinds of L & S patterns composed of a L & S pattern where a ratio of a line width and a space width on a design is 1:1 (hereinafter, dense pattern) and a L & S pattern where a ratio of a line width and a space width on a design is 1:10 (hereinafter, an independent pattern). Actual line widths of the two kinds of L & S patterns on the wafers are measured by CD-SEM (Critical Dimension-Scanning Electron Microscopy).

The inventors of the present invention found out that a relationship between line the width $W_{den}$ ($W_1$) of dense pattern, the setting exposure dose E and PEB setting temperature T (T is absolute temperature) is expressed by the (1).

$$W_{den} = k_0 + k_1 \log E + k_2 (1/T) \quad (1)$$

where $k_0$, $k_1$ and $k_2$ are coefficients determined by using the measured result (actually measured data) of the CD-SEM.

In addition, the inventors found out that a relationship between the inter-pattern dimensional difference IDB between the line width $W_{den}$ of dense pattern and the line width $W_{iso}$ ($W_2$) of isolated pattern (=$W_{den}$−$W_{iso}$), the setting exposure dose E and the PEB setting temperature T is expressed by the formula (2).

$$IDB = m_0 + m_1 \log E + m_2 (1/T) \quad (2)$$

where $m_0$, $m_1$ and $m_2$ are coefficients determined by using the measured results (actually measured data) of the CD-SEM.

Figures 1, 2:
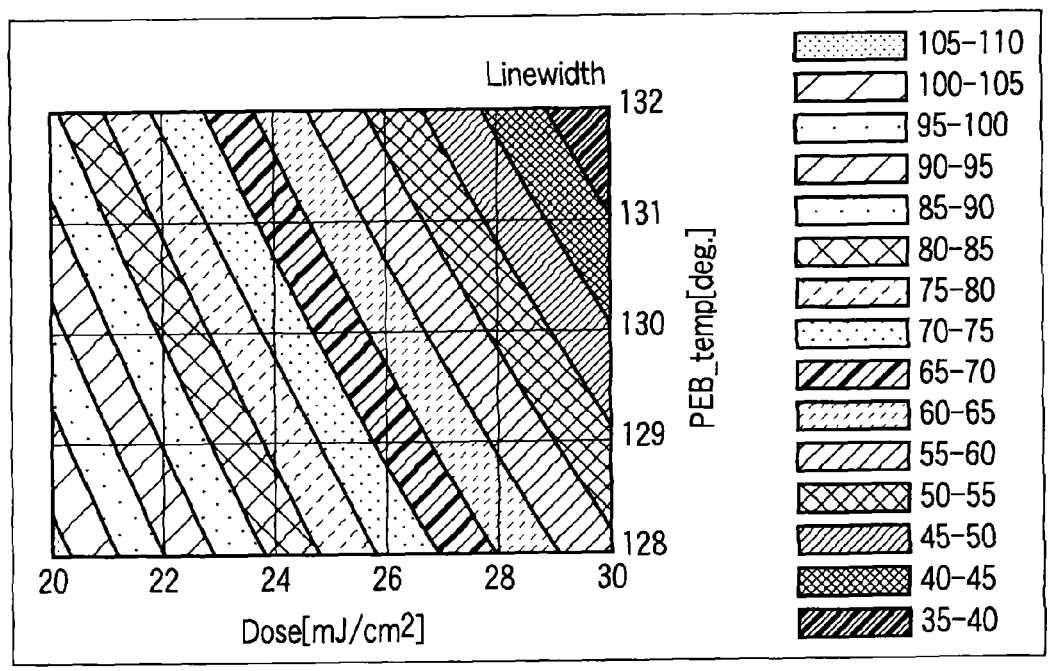
FIG. 1 is a diagram illustrating responses of dimensions of isolated pattern, dimensions of dense pattern, dimensional difference between the isolated pattern and the dense pattern, dose monitor pattern and focus monitor pattern to an effective exposure dose variation and an effective focus variation.
FIG. 2 is a diagram illustrating relationship between dense pattern line width, setting exposure dose and PEB temperature.
Figure 3:
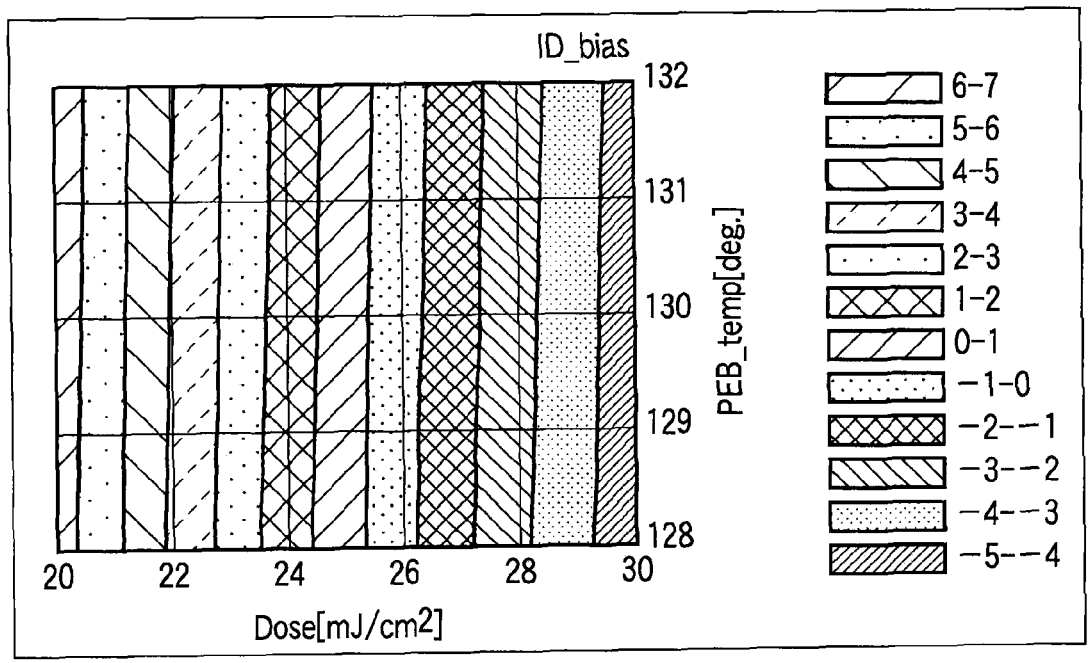
FIG. 3 is a diagram illustrating a relationship among a dimensional difference between patterns, the setting exposure dose and the PEB temperature.

FIG. 2 illustrates a relationship between the dense pattern line width $W_{den}$, the setting exposure dose E and the PEB temperature T derived from the formula (1). FIG. 3 illustrates a relationship between the inter-pattern dimensional difference IDB, the setting exposure dose E and the PEB setting temperature T derived from the formula (2). In FIGS. 2 and 3, temperature (PEB_temp) is expressed by centigrade.

It is found from FIG. 2 that when the PEB setting temperature T varies, the variation of line width $W_{den}$ is large at the same setting exposure dose E. On the other hand, it is found from FIG. 3 that when the PEB setting temperature T varies, the variation of the inter-pattern dimensional difference IDB is sufficiently small at the same setting exposure dose E. Therefore, it is assumed that the inter-pattern dimensional difference IDB does not depend on the PEB setting temperature T, and $m_2$=0 in the formula (2). The formula (2) is rewritten into a formula (2'), and the actually measured data is assigned again so that $m_0$ and $m_1$ are determined.

$$IDB = m_0 + m_1 \log E \quad (2')$$

Next, the method for evaluating the lithography apparatus according to the embodiment using the formulas (1) and (2') will be described.

Figure 4:
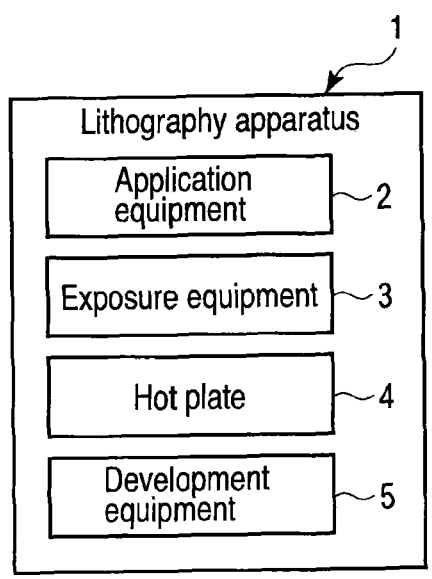
FIG. 4 is a diagram schematically illustrating a lithography apparatus.

FIG. 4 is a diagram schematically illustrating the lithography apparatus. The lithography apparatus 1 comprises an application equipment (coating equipment) 2 which applies a resist onto a wafer, an exposure equipment 3 which exposes the resist applied to the wafer, a hot plate 4 which heats the exposed resist, and a development equipment (developer) 5 which develops the heated resist so as to form a resist pattern. The exposure equipment 3 is, for example, an ArF exposure equipment.

Figure 5:
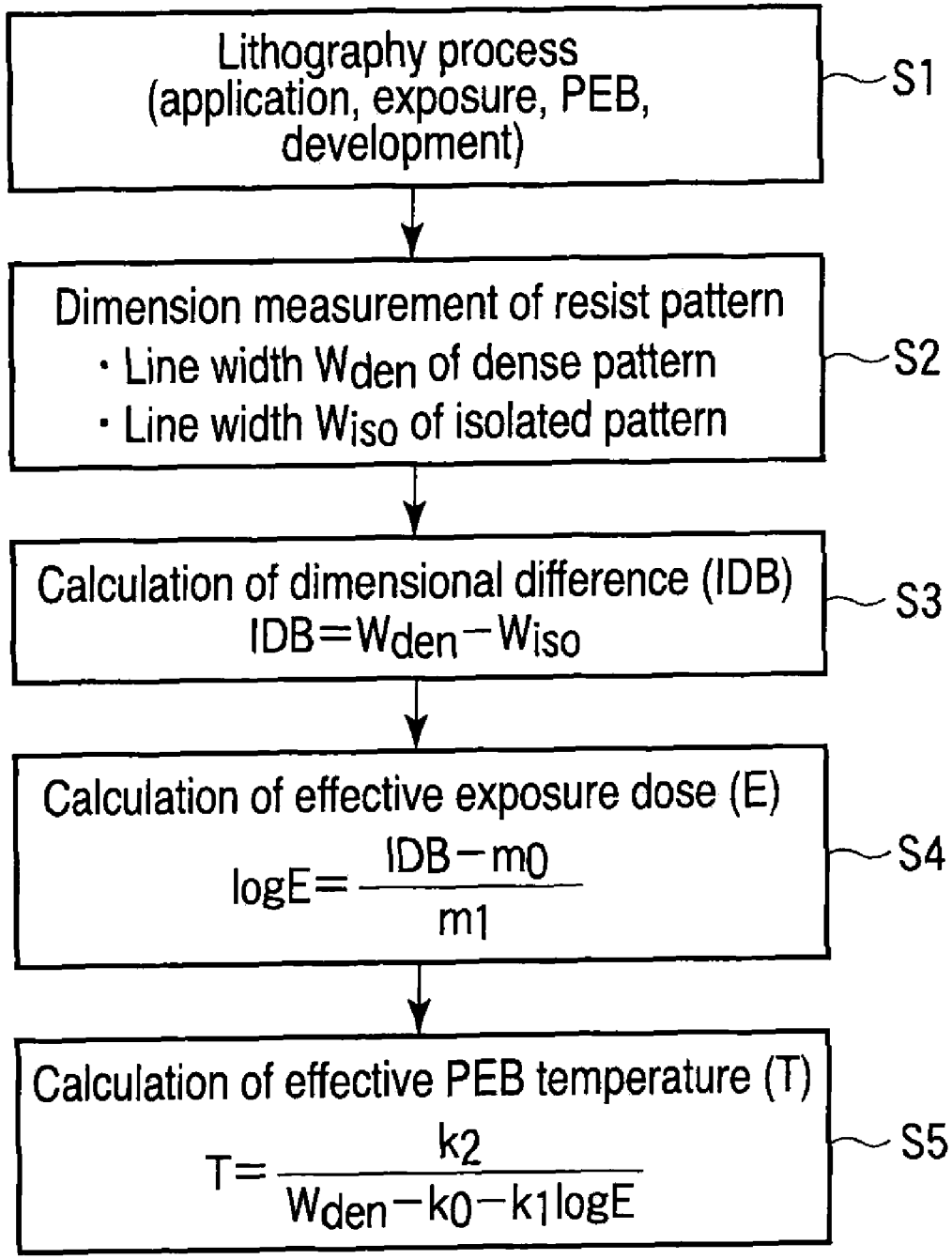
FIG. 5 is a flow chart illustrating a method for evaluating the lithography apparatus according to the embodiment.

FIG. 5 is a flow chart illustrating the method for evaluating the lithography apparatus according to the embodiment.

First, a well known lithography process (application step, exposing step, PEB step and developing step) is executed on the plurality of wafers in actual product lot by using the lithography apparatus 1 shown in FIG. 4 (step S1). The resist pattern including the dense pattern and the isolated pattern is formed by the lithography process. The dense pattern and the independent pattern are formed for each exposure field.

The wafer is extracted from the product lot, and a dimension of the line width $W_{den}$ of the dense pattern and a dimension of the line width $W_{iso}$ of the isolated pattern are measured for each exposure field (step S2). This measurement is made by using, for example, CD-SEM. In the product lot, the setting exposure dose and the focus of the exposure equipment 3 are constant in each exposure field in the wafer.

Next, the inter-pattern dimensional difference IDB (=$W_{den}$−$W_{iso}$) is calculated based on the measured result at step S2 (step S3).

Next, the calculated inter-pattern dimensional difference IDB is assigned to the formula (2'), so that the setting exposure dose E is calculated for each exposure field (step S4). The calculated setting exposure dose E is estimated to include the effective exposure dose due to the influence such as variation of thickness of under lying film or resist, or uneven development. For this reason, the inter-pattern dimensional difference IDB varies in each field, and the estimated exposure dose is considered to be varied in each field. Originally, the setting exposure dose set on the exposure equipment is constant in each exposure field, but the calculated setting exposure dose E changes in each field. Further, it is confirmed in advance that the focus variation in each field is sufficiently small.

The calculated setting exposure dose is used for evaluating the exposure equipment. A determination is made whether the calculated exposure dose exceeds a predetermined constant value (permitted value). When the calculated setting exposure dose exceeds the constant value, for example, maintenance is done on the exposure equipment 3. In addition, a difference between the setting exposure dose E which is actually set on the exposure equipment 3 and the calculated exposure dose E (difference in the exposure dose) may be obtained. In this case, a determination is made whether the difference in the exposure dose exceeds a predetermined constant value (permitted value). When the difference in the exposure dose excesses the constant value, maintenance is done on the exposure equipment 3.

Next, the setting exposure dose E calculated for each exposure field and line width $W_{den}$ of the dense pattern are assigned to the formula (1), so that the PEB setting temperature T is calculated (step S5). The calculated PEB setting temperature T is also estimated to be the effective PEB temperature including temperature fluctuation of hot plate at the time of PEB (temperature variation), which is not setting value.

The calculated PEB setting temperature (effective PEB temperature) is used for evaluating the hot plate. A determination is made whether the effective PEB temperature exceeds the predetermined constant value (permitted value). When the effective PEB temperature exceeds the constant value, maintenance is done on the hot plate 4. In addition, a difference between the PEB setting temperature T which is actually set on the hot plate 4 and the effective PEB temperature may be obtained. In this case, a determination is made whether the temperature difference exceeds the constant value (permitted value). When the temperature difference exceeds the constant value, maintenance is done on the hot plate 4.

As mentioned above, according to the present embodiment, the lithography apparatus evaluating method, which evaluates the lithography apparatus by separating the effective exposure dose including the influence of the variation of thickness of underlying film, variation of thickness of resist, and uneven development into the exposure dose variation and the PEB temperature variation, can be realized.

In the present embodiment, the relationship between the pattern dimension, the exposure dose and the PEB temperature, and the relationship between the inter-pattern dimensional difference, the exposure dose and the PEB temperature are obtained by experiments, but they may be obtained by simulation. In addition, in the present embodiment, the relationship between the pattern dimension, the exposure dose and the PEB temperature, and the relationship between the inter-pattern dimensional difference, the exposure dose and the PEB temperature are expressed in the form of formulas, but they may be expressed in the form of graphs or reference tables. In addition, the pattern is not limited to the line pattern, but may be a hole pattern such as a contact hole or a via hole.

Second Embodiment

Figure 6:
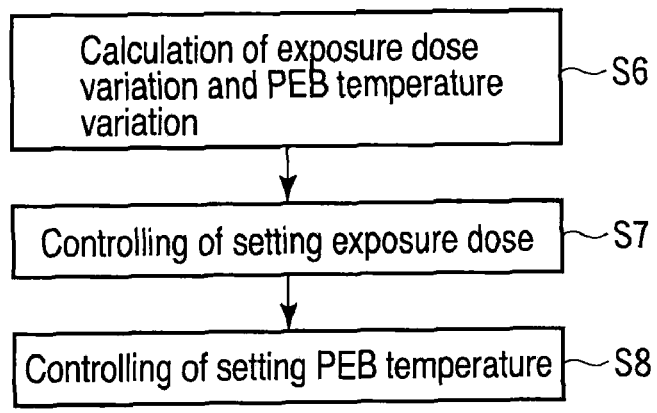
FIG. 6 is a diagram schematically illustrating a lithography apparatus according to a second embodiment.
Figure 7:
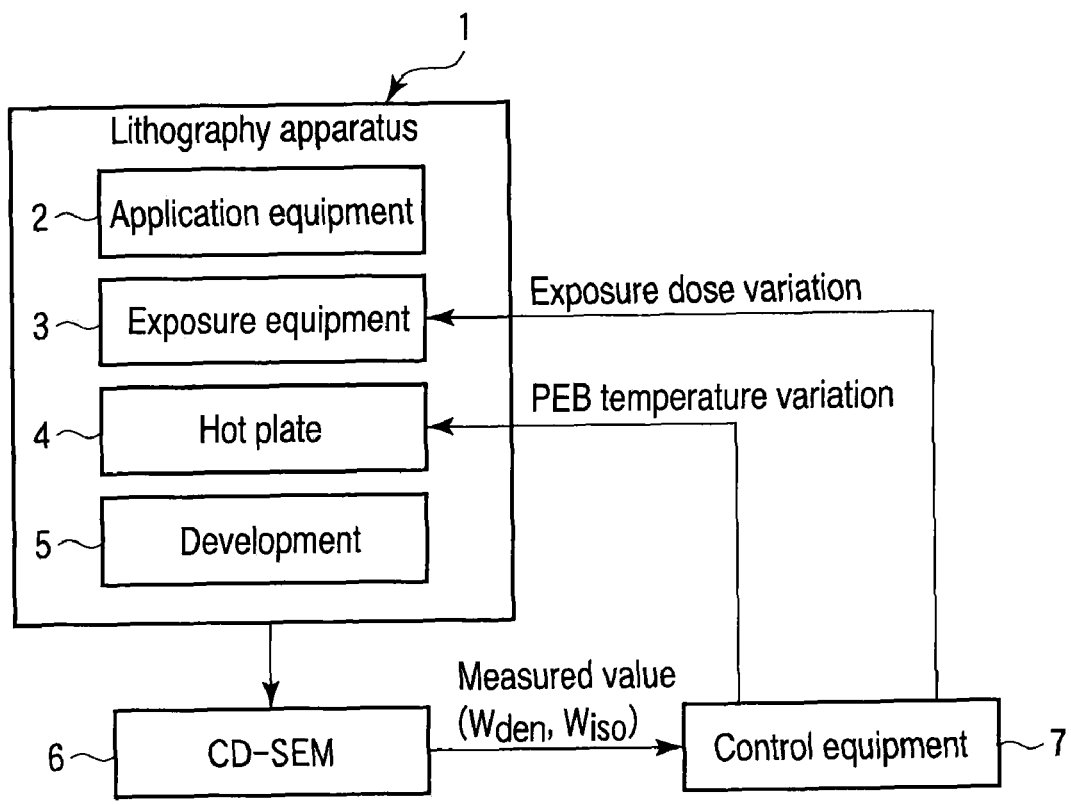
FIG. 7 is a flow chart illustrating a method for controlling the lithography apparatus according to the embodiment.

FIG. 6 is a diagram schematically illustrating a lithography apparatus according to a second embodiment of the present invention. FIG. 7 is a flow chart illustrating a method for controlling the lithography apparatus according to the present embodiment. The portions in FIGS. 6 and 7 corresponding to the portions in FIGS. 4 and 5 are denoted by the same reference numerals and omitted its detail explanation.

The lithography apparatus according to the second embodiment has a configuration in which a CD-SEM 6 and a control equipment 7 are added to the lithography apparatus shown in FIG. 4.

The CD-SEM 6 is a measuring equipment for measuring dimensions (step S2). The dimensions ($W_{den}$ and $W_{iso}$) measured by the CD-SEM 6 are input into the control equipment 7.

The control equipment 7 executes steps S3 to S5 in FIG. 5 based on the input dimensions ($W_{den}$ and $W_{iso}$).

The control equipment 7 calculates a difference (exposure dose variation) between the calculated setting exposure dose E and the actually set exposure dose E and a difference (PEB temperature variation) between the calculated PEB setting temperature (effective PEB temperature) and the actually set PEB temperature T (step S6).

The control equipment 7 controls the setting exposure dose on the exposure equipment 3 for each field such that the exposure variation is to be equal to or less than the constant value (within a permitted range) (step S7).

After the controlling of setting exposure dose (step 7), the control equipment 7 controls the temperature of the hot plate 4 by intentionally providing temperature gradient such that the PEB temperature variation is to be equal to or less than the constant value (within a permitted range) (step S8).

In the present embodiment, the controlling is performed in a manner that the PEB temperature variation is decreased by changing the setting PEB temperature (this does not change the inter-pattern dimensional difference IDB.), and the variation other than the PEB temperature variation, i.e., the exposure dose variation (this will change the inter-pattern dimensional difference IDB.) is decreased by changing the setting exposure dose (the inter-pattern dimensional difference IDB is put back). Therefore, according to the present embodiment, the exposure dose variation and the effective PEB variation are improved, and then the uniformity of the dimensions on the wafers is improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An evaluation method for lithography apparatus, the lithography apparatus comprising a coating unit configured to apply resist on a substrate, an exposure unit configured to expose the resist applied on the substrate, a heating unit configured to heat the exposed resist and a development unit configured to develop the heated resist to form a resist pattern, the evaluation method comprising:

forming an evaluation resist pattern by using the lithography apparatus, the evaluation resist pattern including first and second evaluation patterns, the first and second evaluation patterns having different peripheral environments respectively;

measuring dimensions of the first and second evaluation patterns to obtain a dimensional difference between the first and second resist evaluation patterns;

estimating an exposure dose of the resist when the resist is exposed by the exposure unit, the estimating the exposure dose being performed based on the dimensional difference between the first and second resist evaluation patterns; and estimating an effective heating temperature of the resist when the resist is heated by the heating unit, the estimating the effective heating temperature being performed based on the estimated exposure dose and the dimensional difference.

2. The evaluation method according to claim 1, wherein the estimating the exposure dose is performed by using a previously obtained relationship, the previously obtained relationship includes a relationship between the dimensional difference and a setting exposure dose on the exposure unit when the resist is exposed by the exposure unit, and the estimating the effective heating temperature is performed by using a previously obtained relationship, the previously obtained relationship includes a relationship between the dimensional difference, the heating unit and a setting heating temperature of the heating unit when the resist is heated by the heating unit.

3. The evaluation method according to claim 1, wherein the first evaluation pattern is a repeated pattern, the second resist evaluation pattern is a repeated pattern having same shape as the repeated pattern of the first evaluation pattern and having different cyclic period as the repeated pattern of the first evaluation pattern.

4. The evaluation method according to claim 1, further comprising obtaining an exposure dose difference between a setting exposure dose on the exposure unit when the resist is exposed by the exposure unit and the estimated exposure dose, and obtaining a heating temperature difference between a setting heating temperature of the heating unit when the resist is heated by the heating unit and the estimated effective heating temperature.

5. The evaluation method according to claim 1, wherein the first evaluation pattern includes a first line and space pattern having a first ratio of line width to space width, the second evaluation pattern includes a second line and space pattern having a second ratio of line width to space width higher than the first ration.

6. The evaluation method according to claim 5, wherein the measuring the dimensions of the first and second evaluation patterns includes measuring the line widths of the first and second line and space patterns.

7. The evaluation method according to claim 6, wherein the measuring the line widths of the first and second line and space patterns is performed by using CD-SEM.

8. The evaluation method according to claim 6, wherein the line width of the first line and space pattern, the line width of the second line and space pattern, a setting exposure dose on the exposure unit satisfy an equations, $$W_1 - W_2 = m_0 + m_1 \log E$$

where $W_1$ is the line width of the first line and space pattern, $W_2$ is the line width of the second line and space pattern, E is the setting exposure dose, and $m_0$ and $m_1$ are coefficients determined by measurement result of the measuring the line widths of the first and second line and space patterns.

9. The evaluation method according to claim 7, wherein the estimating the exposure dose is performed by deriving E in the equation.

10. The evaluation method according to claim 6, wherein the line width of the first line and space pattern, a setting exposure dose on the exposure unit and a setting temperature of the heating unit satisfy an equation, $$W_1 = k_0 + k_1 \log E + k_2 (1/T)$$

where $W_1$ is the line width of the first line and space pattern, E is the setting exposure dose, T is the setting temperature, and $k_0$, $k_1$ and $k_2$ are coefficients determined by measurement result of the measuring the line widths of the first and second line and space patterns.

11. The evaluation method according to claim 10, wherein the estimating the effective heating temperature is performed by deriving T in the equation.

12. An control method for lithography apparatus, the lithography apparatus comprising a coating unit configured to apply resist on a substrate, an exposure unit configured to expose the resist applied on the substrate, a heating unit configured to heat the exposed resist, and a development unit configured to develop the heated resist to form a resist pattern, the control method comprising:

setting a setting exposure dose on the exposure unit when the resist is exposed by the exposure unit such that an exposure dose difference is to be not higher than a predetermined value, the exposure dose difference being difference between the setting exposure dose and an exposure dose estimated by an evaluation method for lithography apparatus, the evaluation method comprising forming an evaluation resist pattern by using the lithography apparatus, the evaluation resist pattern including first and second evaluation patterns, the first and second evaluation patterns having different peripheral environments respectively; measuring dimensions of the first and second evaluation patterns to obtain a dimensional difference between the first and second resist evaluation patterns; estimating an exposure dose of the resist when the resist is exposed by the exposure unit, the estimating the exposure dose being performed based on the dimensional difference between the first and second resist evaluation patterns; and estimating an effective heating temperature of the resist when the resist is heated by the heating unit, the estimating the effective heating temperature being performed based on the estimated exposure dose and the dimensional difference; and setting a setting heating temperature on the heating unit when the resist is heated by the heating unit such that a heating temperature difference is to be not higher than a predetermined value, the heating temperature difference being difference between the setting heating temperature and the estimated effective heating temperature estimated by the evaluation method.

* * * * *

UNITED STATES PATENT AND TRADEMARK OFFICE
CERTIFICATE OF CORRECTION

| | | |
|---|---|---|
| PATENT NO. | : 7,883,824 B2 | |
| APPLICATION NO. | : 12/405710 | |
| DATED | : February 8, 2011 | |
| INVENTOR(S) | : Asano et al. | |

It is certified that error appears in the above-identified patent and that said Letters Patent is hereby corrected as shown below:

Claim 7, column 7, line 54, change "an equations" to --an equation--.

Claim 12, column 8, line 21, change "An control method" to --A control method--.

Signed and Sealed this
Seventeenth Day of May, 2011

David J. Kappos
*Director of the United States Patent and Trademark Office*